United States Patent
Slat

(10) Patent No.: US 6,592,956 B2
(45) Date of Patent: Jul. 15, 2003

(54) PLASTIC CONTAINER HAVING A CARBON-TREATED INTERNAL SURFACE

(75) Inventor: William A. Slat, Brooklyn, MI (US)

(73) Assignee: Plastipak Packaging, Inc., Plymouth, MI (US)

(*) Notice: Subject to any disclaimer, the term of this patent is extended or adjusted under 35 U.S.C. 154(b) by 0 days.

(21) Appl. No.: 10/135,088

(22) Filed: Apr. 29, 2002

(65) Prior Publication Data

US 2002/0127333 A1 Sep. 12, 2002

Related U.S. Application Data

(63) Continuation of application No. 09/525,871, filed on Mar. 14, 2000, now Pat. No. 6,495,226, which is a continuation-in-part of application No. 09/370,642, filed on Aug. 6, 1999, now Pat. No. 6,475,579.

(51) Int. Cl.$^7$ ................................. B65D 23/02
(52) U.S. Cl. ................ 428/35.7; 428/36.6; 427/237; 427/256; 215/12.2
(58) Field of Search .................. 427/237, 238, 427/240, 256, 575, 577, 585; 428/35.7, 36.6; 215/12.1, 12.2

(56) References Cited

U.S. PATENT DOCUMENTS

| 4,756,964 A | 7/1988 | Kincaid et al. |
| 5,464,106 A | 11/1995 | Slat et al. |
| 5,565,248 A | 10/1996 | Plester et al. |
| 5,677,010 A | 10/1997 | Esser et al. |
| 5,690,745 A | 11/1997 | Grunwald et al. |
| 5,798,139 A | 8/1998 | Nagashima et al. |
| 5,849,366 A | 12/1998 | Plester et al. |

FOREIGN PATENT DOCUMENTS

| DE | 3632748 | 4/1988 |
| DE | 4316349 | 11/1994 |
| EP | 0739655 | 10/1966 |
| EP | 0575299 | 12/1993 |
| EP | 0773166 | 5/1997 |
| WO | WO 9949991 | 10/1999 |

*Primary Examiner*—Harold Pyon
*Assistant Examiner*—Sow-Fun Hon
(74) *Attorney, Agent, or Firm*—Robert H. Bachman

(57) ABSTRACT

A blow molded container having barrier properties and including an upper wall portion having an opening, an intermediate sidewall portion positioned beneath the upper wall portion, and a base portion positioned beneath the intermediate sidewall portion to support the container. The container includes a molded outer layer having an inner surface and an outer surface formed from at least 40% of recycled plastic, and a carbon coating formed on the inner surface of the outer layer and adhered thereto and substantially coextensive with the outer layer, wherein said carbon coating has a thickness of less than about 10 microns.

25 Claims, 2 Drawing Sheets

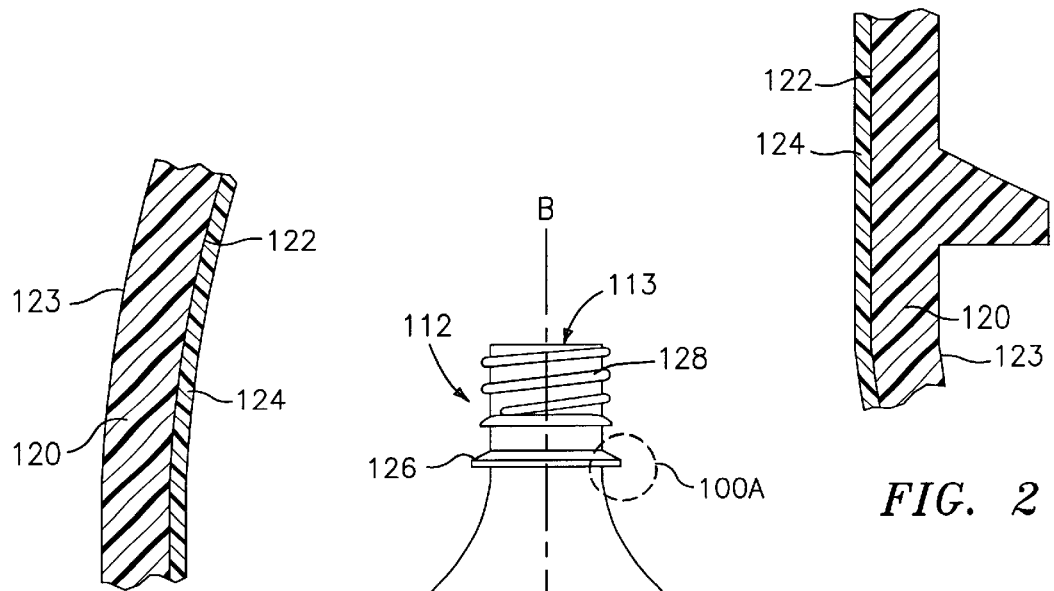
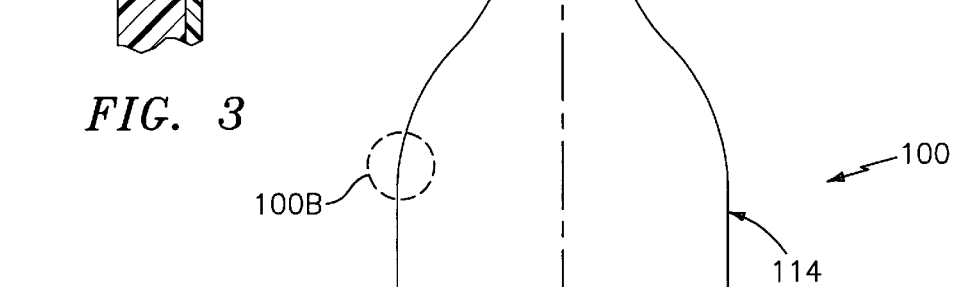
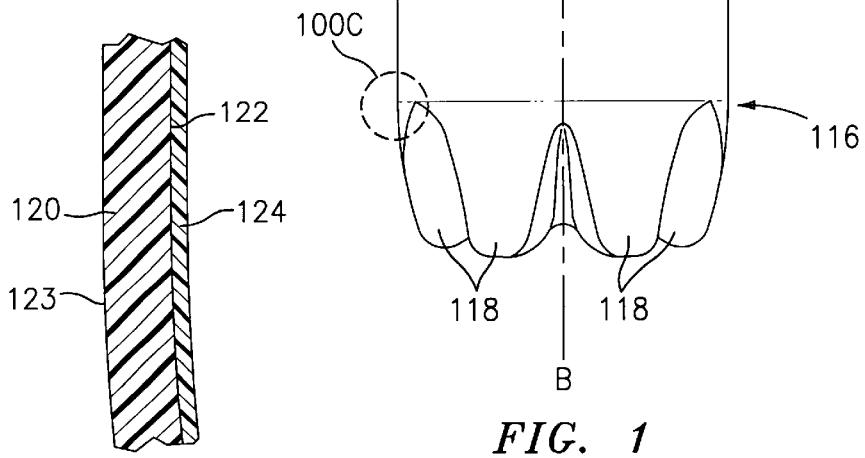
FIG. 3
FIG. 2
FIG. 1
FIG. 4

PLASTIC CONTAINER HAVING A CARBON-TREATED INTERNAL SURFACE

CROSS-REFERENCE TO RELATED APPLICATIONS

This application is a Continuation of U.S. patent application Ser. No. 09/525,871, filed Mar. 14, 2000, By William A. Slat, now U.S. Pat. No. 6,495,226, which is a Continuation-In-Part of U.S. patent application Ser. No. 09/370,642 for MULTI-LAYERED CONTAINER HAVING CARBON-TREATED INTERNAL SURFACE AND METHOD FOR MAKING THE SAME, By William A. Slat, filed Aug. 6, 1999 now U.S. Pat. No. 6,475,579.

TECHNICAL FIELD

The present invention relates to plastic containers based on recycled plastic. More particularly, the present invention relates to blow molded plastic containers based on recycled plastic, having barrier properties and having a carbon-coated internal surface.

BACKGROUND ART

It is highly desirable to provide plastic containers having barrier properties, and it is also highly desirable to provide plastic containers using recycled plastic. However, recycled plastic generally does not have barrier properties and cannot be used in containers in direct contact with container contents. Therefore, despite the economic desirability of using recycled plastic, the use of such material has been difficult.

Conventionally, the use of recycled plastic in containers especially those holding contents for human consumption has been limited to multi-layer plastic containers where the recycled plastic is an outer layer which does not come into direct contact with the container contents.

Multi-layer plastic containers are commonly used for packaging items in a wide range of fields, including food and beverage, medicine, health and beauty, and home products. Plastic containers are known for being easily molded, cost competitive, lightweight, and generally suitable for many applications. Multi-layered containers provide the benefit of being able to use different materials in each of the layers, wherein each material has a specific property adapted to perform a desired function.

Because plastic containers may permit low molecular gases, such as oxygen and carbon dioxide, to slowly permeate through their physical configurations, the use of plastic containers sometimes proves to be less desirable when compared to containers formed from other less permeable materials, such as metal or glass. In most applications, the shelf life of the product contents is directly related to the package's ability to effectively address such molecular permeation. In the case of carbonated beverages, such as beer, oxygen in the atmosphere surrounding the container can gradually permeate inwardly through the plastic walls of the container to reach inside of the container and deteriorate the contents. Likewise, carbon dioxide gas associated with the contents may permeate outwardly through the plastic walls of the container until eventually being released on the outside, causing the carbonated beverage to lose some of its flavor and possibly become "flat".

To address some to the foregoing concerns, plastic container manufacturers have utilized various techniques to reduce or eliminate the absorption and/or permeability of such gases. Some of the more common techniques include: increasing the thickness of all or portions of the walls of the container; incorporating one or more barrier layers into the wall structure; including oxygen-scavenging or reacting materials within the walls of the container; and applying various coatings to the internal and/or external surface of the container. However, a number of conventional barrier and/or scavenger materials will not effectively curtail the permeation of both oxygen and carbon dioxide over extended periods of time. Moreover, there are usually other practical concerns associated with most conventional techniques, most commonly, increased material costs and/or production inefficiencies.

In recent times, the use of plastics has become a significant social issue. Recycling has become an increasingly important environmental concern and a number of governments and regulatory authorities continue to address the matter. In a number of jurisdictions, legislation pertaining to minimum recycled plastic content and the collection, return, and reuse of plastic containers has either been considered or has already been enacted. For example, in the case of plastic containers used to hold consumable items, such as food items or beverages, regulations often require a certain content and minimum thickness of the innermost layer that comes in contact with the contents. Conventional processes, such as co- or multiple-injection molding, are often limited as to the amount of recycled plastic that can be effectively incorporated into the structure of the container. Commonly, the amount of recycled content that can be effectively incorporated into conventional co-injection molded containers that are suitable for food contents is less than 40% of the total weight of the container.

Therefore, a need exists in the industry and it is an object of the present invention to provide a plastic container having a high recycled content that is suitable for holding carbonated products, such as carbonated beverages, and provides an acceptable level of performance when compared to commercial containers formed from alternative materials. A further need exists for a method to produce such containers in high volume commercial rates using conventional equipment.

It is a still further object of the present invention and need to provide a container based on recycled plastic which has barrier properties and which minimizes or avoids the high cost of inconvenience of conventional multi-layer plastic containers. It is a still further objective to do this at a reasonable cost, in a commercially feasible process, and with an effective product.

DISCLOSURE OF INVENTION

It has been found that the foregoing objects and advantages are readily obtained in accordance with the present invention.

Recognizing the problems and concerns associated with conventional multi-layered plastic containers, especially those used to hold carbonated beverages, a plastic container having enhanced gas barrier properties and a high content of recycled plastic is advantageously provided. A container constructed in accordance with the principles of the present invention provides several advantages over those previously available. Such advantages are generally realized through the use of the desirable recycled plastic and a carbon coating on the internal surface of the recycled plastic. It is a significant advantage that the container of the present invention has a significant amount of recycled content. Furthermore, the improved container can be produced using conventional processing techniques and manufacturing equipment.

An important aspect of the present invention is the effective barrier properties of the present container with the functional and commercial benefits associated with having a container comprised a significant amount of recycled plastic content. Further, the ease in subsequently recycling a container produced in accordance with the principles of the present invention make the practice of the invention extremely advantageous. Moreover, the present invention provides the additional advantage of permitting the manufacturer to controllably vary the material positioning and wall thickness at any given location along the vertical length of the inner and/or outer layers of the container.

In accordance with the principles of the present invention, a blow molded multi-layer container is provided having an upper wall portion, an intermediate sidewall portion positioned beneath the upper wall portion, and a base portion positioned beneath the intermediate sidewall portion, the base portion being adapted to dependently or independently support the container. The container includes a molded outer layer formed from recycled plastic and a carbon coating on the inner surface of the molded outer layer that is substantially coextensive with the inner layer. The recycled outer layer comprises at least 50% by weight of recycled plastic, but can comprise more than 75% by weight and desirably more than 90% by weight, depending upon the needs of the application. In a preferred embodiment, the thickness of the outer layer is controllably adjusted along its vertical length. If desirable, the outer layer may also include additional barrier materials and/or oxygen scavenging/reacting materials incorporated therein.

Other and further advantages and novel features of the invention are readily apparent from the following detailed description of the best mode for carrying out the invention when taken in connection with the accompanying drawings, wherein, by way of illustration and example, embodiments of the present invention are disclosed.

BRIEF DESCRIPTION OF THE DRAWINGS

The present invention will be more readily understandable from consideration of the accompanying drawings, wherein:

FIG. 1 is an elevation view of a container in accordance with the principles of the present invention.

FIGS. 2, 3 and 4 are cross-sectional and enlarged views of various areas of the container wherein the relative thicknesses of the layers forming the container are illustrated.

BEST MODE FOR CARRYING OUT THE INVENTION

Figure 5:
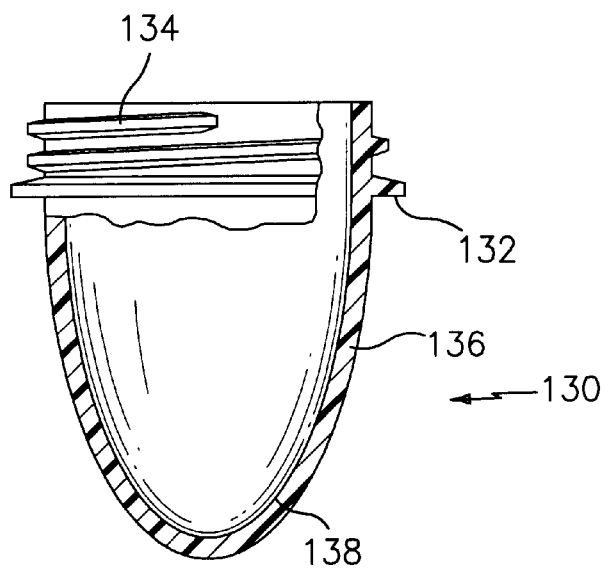
FIG. 5 is a partially broken away elevation view of one example of a preform.

Referring now to the drawings in detail, wherein like reference numerals and letters designate like elements, there is shown in FIG. 1 an elevational view of a container 100 constructed in accordance with the principles of the present invention. Container 100 typically includes an upper wall portion 112, including an opening 113; an intermediate sidewall portion 114 positioning beneath the upper wall portion 112; and a base portion 116 positioned beneath the intermediate sidewall portion 114. The base portion 116 is adapted to support the container 100 either dependently, i.e., where another object such as a base cup (not shown) is used, or independently, i.e., where no other objects are needed to stand the container upright on a generally flat surface. In a preferred embodiment, the container 10 is supported by a freestanding base formed by a plurality of integrally formed feet 118, such as those illustrated in FIG. 1.

Referring to FIGS. 2–4, which represent enlarged detailed views of areas 100A, 100B and 100C, respectively, of FIG. 1, the container 100 includes a molded outer layer 120, having a vertical length, an inner surface 122, an outer surface 123 and a central vertical axis B. The inner surface 122 of the molded outer layer 120 is at least partially coated with a thin layer or film of carbon 124. While complete encapsulation of the inner layer 120 by the carbon layer 124 is preferred, it may not be required for particular applications. It is preferred that the molded outer layer 120 is substantially coextensive with the carbon layer 124 and provide structural support for the container 100.

The molded outer layer 120 includes at least 50% of recycled plastic material, desirably at least 75% of recycled plastic, and may include as much as 90% recycled plastic material. If desired, the molded outer layer may be 100% recycled plastic material. Preferably, the molded outer layer is formed from recycled polyethylene terephthalate (PET), but the present invention is not limited thereto and virtually any recycled plastic may be conveniently employed.

The molded outer layer 120 desirably comprised of a thermoplastic material. The following resins as well as others may be conveniently used as plastic materials for the outer layer 120: polyethylene resin, polypropylene resin, polystyrene resin, cycloolefine copolymer resin, polyethylene terephthalate resin, polyethylene naphthalate resin, ethylene-(vinyl alcohol) copolymer resin, poly-4-methylpentene-1 resin, poly(methyl methacrylate) resin, acrylonitrile resin, polyvinyl chloride resin, polyvinylidene chloride resin, styrene-acrylo nitrile resin, acrylonitrile-butadien-styrene resin, polyamide resin, polyamideimide resin, polyacetal resin, polycarbonate resin, polybutylene terephthalate resin, ionomer resin, polysulfone resin, polytetra fluoroethylene resin and the like.

Desirably, the outer layer may be blended with other materials, as virgin polyethylene terephthalate, polyethylene naphthalate (PEN), and/or blends of polyethylene terephthalate and polyethylene naphthalate. However, other thermoplastic resins may also be blended with the recycled plastic.

It is particularly desirable to blend small amounts of barrier materials and/or oxygen scavenging or reacting materials with the recycled plastic. For example, less than 5% by weight of saran, ethylene vinyl alcohol copolymers (EVOH) and acrylonitrile copolymers, such as Barex. The term saran is used in its normal commercial sense to contemplate polymers made for example by polymerizing vinylidene chloride and vinyl chloride or methyl acrylate. Additional monomers may be included as is well known. Vinylidene chloride polymers are often the most commonly used, but other oxygen barrier materials are well known. Oxygen-scavenging materials can include materials marketed for such a purposes by several large oil companies and resin manufacturers. A specific example of such a material is marketed under the trade name AMOSORB and is commercially available from the Amoco Corporation. In addition, the present invention can readily use ultra low intrinsic viscosity (IV) material, e.g., material having an IV of less than around 0.60 or 0.55. These materials are frequently white or whitish in color. A significant advantage of the present invention is ability to process in-process scrap simply and efficiently, even with materials as aforesaid.

The inner surface 122 of the outer layer 120 is coated with a thin layer of carbon 124 which provides enhanced barrier properties to the container 100. In a preferred embodiment, the carbon coating 124 is comprised of a highly hydrogenated amorphous carbon that is doped with nitrogen. The thickness of the carbon coating 124 is less than about 10 μm and the weight of the coating 124 is less than about 1/10,000th of the total weight of the container. An important feature of the present invention is that only about 3 mg of the carbon coating 124 is needed to treat a 500 cc plastic container. Further, despite the notable thinness of the carbon coating 124, the amount of barrier protection afforded is quite significant and the protection from permeation of oxygen and carbon dioxide is favorable when compared with the protection found in metal cans and glass bottles. Thus, for example, the barrier provided in connection with the present invention against oxygen permeation can be more than thirty times better than that of a container formed from untreated PET; the barrier provided against carbon dioxide permeation can be more than seven times better than that of a container formed from untreated PET; and the barrier provided against the migration of total aldehydes can be more than six times better than untreated PET.

The molded outer layer 120 has a wall thickness, taken along its vertical length, that is in the range of 6 to 23 mils (0.1524 mm to 0.5842 mm). As illustrated in FIGS. 1–4, the thickness of the outer layer can also be separately and independently varied along its vertical length. In this manner, different portions of the container 100 (taken perpendicular to the central vertical axis B) can have different thicknesses, all by design. For instance, the thickness of the molded outer layer 120 positioned at the upper portion 112 (such as shown in FIG. 2) can be much thicker than the intermediate sidewall portion 114 (such as shown in FIG. 3). Likewise, the thickness of the outer layer 120 at the base wall portion 116 (such as shown in FIG. 4) can be thicker than the thickness of the same layer in the intermediate sidewall portion 114 such as shown in FIG. 3). Because the molded outer layer 120 is generally comprised of a less expensive plastic material that does not directly contact the contents of the container 100, a less expensive material can be used to form the bulk of the container including a number of the structural integral components for the container, such as the neck flange 126 and outer threads 128 shown in FIG. 1.

Similarly, the inner carbon coating can be readily varied so that the thickness thereof varies along the vertical length of the container. Desirably, however, for convenience a substantially uniform carbon coating is provided.

A significant advantage of the present invention is its ability to provide significant barrier properties, incorporate a high content of recycled plastic material, and be advantageous to present day recycling. The outer layer 120 is comprised of plastic material and can be readily recycled. Unlike a number of other barrier materials often used in connection with multi-layer containers, which can be difficult to separate, the carbon coating 124 of the present invention has no impact on the recycling of the plastic materials of which the container 100 is comprised.

The present invention includes the additional advantage of being able to provide a container 100 with enhanced barrier properties that can be used for holding food products. Plastic containers having an inner surface treated with an amorphous carbon film have been approved for contact with food products from the Technische National Onderzoek, the standards organization accredited by the European Economic Community. The approval of the United States Food and Drug Administration (USFDA) is currently in process.

The container of the present invention may be formed by any of several known processing techniques which permit the manufacture of a single layer or multi-layer blow molded container. This represents a considerable advantage. In a preferred embodiment, the container 100 is formed via a blow molding operation involving a preform 130, such as the one generally depicted in FIG. 5. Although not a required feature, the preform 130 may include a neck flange 132 (for handling purposes) and outer threads 134 (to secure a closure) that corresponds to the same features shown in FIG. 1. After the blow molding of the container to form the final container 100 an embodiment of which is shown in FIG. 1, but some time before the filling operation, the inner surface 122 of the container is carbon-treated as further discussed below.

In a first embodiment, a preform 130 which will become the container is produced by extrusion molding a preform 130 with a preform body 136 and a preform inner surface 138. An extrusion process permits the manufacturer to readily vary the thickness of material being extruded along the length of the extrudate. Variations in the thickness of the preform is desirable for several reasons which include aesthetics, efficient material use and reduced costs, and variable strength requirements.

The preform 130 is formed from at least 50% of recycled plastic material which, as indicated hereinabove is a particular advantage of the present invention.

Figure 6:
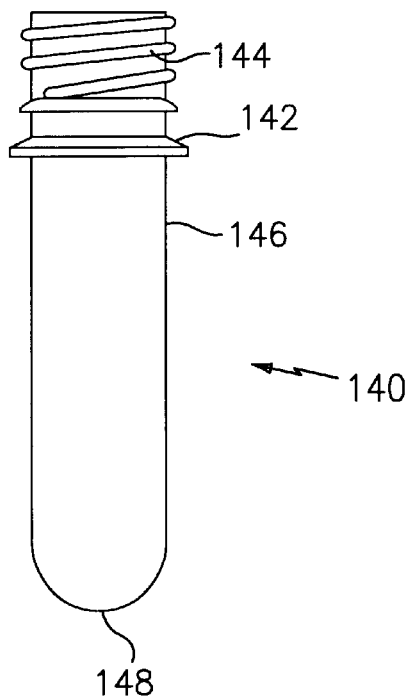
FIG. 6 is a partially broken away elevation view of another example of a preform.

In a second embodiment, a preform 140 as shown in FIG. 6 is produced by thermoforming a thin sheet of plastic material and forming that sheet into what will become the preform 140, or injection or compression molding the preform 140. Thus, preform 140 of FIG. 6 may include a neck flange 142 and outer threads 144, body portion 146 which will become the container body portion and base portion 148 which will become the container base portion.

The container can then be blown using conventional blow molding operations. Because the preform will be stretched and "thinned-out" during the subsequent blow molding process, the thickness of the preform, at portions corresponding to like portions of the blown container, will inherently be somewhat thicker. In fact, the thickness of the various portions of the preform are typically designed to take into account the amount of stretch and hoop expansion necessary to form the thickness profile desired in the final container 100.

After the preform has been formed into an intermediate container by blow molding, a carbon coating is formed on at least a portion of the inner surface 122 of the container 120 and preferably on the entire inner surface. The carbon coating 124 does not have to be immediately applied to the container, however, it is generally more efficient to apply the carbon coating promptly after the intermediate container has been blown and is within an appropriate temperature profile.

In a preferred embodiment, the blown intermediate containers are removed from a conventional high-speed rotary blow-molding machine and subsequently transferred, directly or indirectly (i.e., via intermediate handling steps), to an apparatus for applying a carbon coating 124 to the intermediate containers. In high-speed production applications, the carbon-coating apparatus will typically also be of the rotary type. An example of such an apparatus that can be used to apply the carbon coating to the inner surface of the intermediate containers is available from Sidel of Le Havre, France and is commercially marketed under the "ACTIS" trade name.

A method for carbon-coating the intermediate containers is next described in further detail. In accordance with a preferred method for carbon coating the inner surface of the intermediate container, a conventional carbon-coating or carbon-treating apparatus having rotary kinematics and a central vertical axis is provided. The carbon-coating apparatus generally rotates about its central vertical axis in a first rotational direction, e.g. counterclockwise, at a fairly high rotational speed. A blow-molding machine, or other rotary container transfer mechanism, located generally in close proximity to the carbon-coating apparatus functions as the source of intermediate containers for subsequent carbon-coating treatment. To facilitate the transfer, the rotary container transfer mechanism rotates in a direction opposed to the rotational direction of the carbon-coating apparatus, e.g., clockwise, and the intermediate containers are mechanically shifted from the container transfer mechanism to the carbon-coating apparatus. Although not required for the practice of the present invention, the intermediate container preferably includes a neck flange or other physical means for at least partially supporting the intermediate container during the mechanical transfer process.

As the intermediate containers are transferred from the transfer mechanism to the carbon-coating apparatus, they are preferably held in an upright orientation with the opening thereof generally facing upwardly. If desired, a vacuum can also be generated and used to support or partially support the intermediate container. During the transfer process, the individual containers are received by a receiving mechanism which is part of the carbon-coating apparatus. The receiving mechanism revolves around the central axis of the carbon-coating apparatus, grasps or secures the container, and seals the opening of the intermediate container, much like a lid. When properly positioned over and abutting the opening, the receiving mechanism produces a tight to "airtight" seal over the intermediate container.

The receiving mechanism includes at least two apertures positioned above the opening of the intermediate container that are used for the introduction and removal of gases from the inside of the intermediate container. A first aperture in the receiving mechanism is in communication with a vacuum source, such as a vacuum pump. After the receiving mechanism has securely sealed the opening, the air within the intermediate container is discharged through the first aperture by means of a vacuum. It is desirable that degree of vacuum falls within a range of about $10^{-2}$ to $10^{31.5}$ torr, so as to shorten the discharge time for a vacuum and saves necessary energy therefor. With a lower degree of vacuum of over $10^{-2}$ torr, impurities in the container are much increased, on the other hand, with a higher degree of vacuum under $10^{-5}$ torr, increased time and a large energy are needed to discharge the air in the intermediate container.

Once the air inside the intermediate container has been evacuated, the intermediate container is subsequently filled or "charged" with a raw gas that will be used in the formation of the carbon coating as shown in FIGS. 1–4. The flow rate of the raw gas is preferably within a range from about 1 to 100 ml/min. Preferably, the diffusion of the raw gas within the intermediate container is enhanced by providing an extension, such as a tube having a plurality of blowing openings. In accordance with one embodiment, an extension enters inside of the intermediate container through the second aperture some time after the opening is sealed and the extension extends to within about 25.4 mm to 50.8 mm (1.0 in.–2.0 in.) of the lowermost portion of the intermediate container.

The raw gas may be comprised of aliphatic hydrocarbons, aromatic hydrocarbons, oxygen containing hydrocarbons, nitrogen containing hydrocarbons, etc., in gaseous or liquid state at a room temperature. Benzene, toluene, o-xylene, m-xylene, p-xylene and cyclohexane each having six or more than six carbons are preferable. The raw gases may be used singularly, but a mixture of two or more than two kinds of raw gases can also be used. Moreover, the raw gases maybe used in the state of dilution with inert gas such as argon and helium.

At some point after the intermediate container has been received by the receiving mechanism of the carbon-coating apparatus, the container is inserted into a cylinder or other hollow space provided to accommodate the intermediate container. In the preferred embodiment, the carbon-coating apparatus includes a plurality of hollow cylinders that rotate in the same direction as, and in synchronization with, the receiving mechanism. It is further preferred that the receiving mechanism that retains and seals the opening of the intermediate container also functions to cover the cylinder.

After the supply of the raw gas into the container, energy is impressed upon the intermediate container from a high frequency electric energy source, such as a microwave-producing device. The impression of the electric power generates plasma, and causes extreme molecular excitation ionization and a carbon coating to be formed on the inner surface of the container, intermediate container to form a carbon-coating inner surface as shown in FIGS. 1–4.

While the foregoing method illustrates one process for forming a carbon coating in accordance with the present invention, other conventional methods can also be used successfully. For instance, the intermediate container could instead be inserted and accommodated within an external electrode and have an internal electrode positioned within the container. After the container is evacuated and is charged with raw gas supplied through the internal electrode, electric power is supplied from the high frequency electric source to the external electrode. The supply of electric power generates plasma between the external electrode and the internal electrode. Because the internal electrode is earthed, and the external electrode is insulated by the insulating member, a negative self-bias is generated on the external electrode, so that carbon film is formed uniformly on the inner surface of the container along the external electrode.

When the plasma is generated between the external electrode and the internal electrode, electrons are accumulated on the inner surface of the insulated external electrode to electrify negatively the external electrode, to generate negative self-bias on the external electrode. At the external electrode, a voltage drop occurs because of the accumulated electrons. At this time, carbon dioxide as the carbon resource exists in the plasma, and positively ionized carbon resource gas is selectively collided with the inner surface of the intermediate container which is disposed along the external electrode, and, then, carbons close to each other are bonded together thereby to form a hard carbon film comprising a remarkably dense coating on the inner surface 122 of container 100.

The thickness and uniformity of the carbon coating can be varied by adjusting the output of high frequency; the pressure of the raw gas in the intermediate container; the flow rate for charging the container with gas; the period of time during which plasma is generated; the self-bias and kind of raw materials used; and other like variables. However, the thickness of the carbon coating is preferably within a range from 0.05 to 10 $\mu$m to obtain the effective suppression of the permeation and/or absorption of the low molecular organic compound and the improved gas barrier property, in addition to an excellent adhesion to plastic, a good durability and a good transparency.

The container of the present invention offers significant advantages. The base container is a mono-layer material that can be readily processed by conventional means. Moreover, the recycled base material can be readily admixed with other materials and due to the inner carbon coating does not contact the container contents. Moreover, barrier properties are readily and easily obtained and the container contents are not impacted by adverse aromas or taste. Further, the container of the present invention eliminates the need for a separate barrier liner or a virgin liner. The small amount of inner carbon coating dos not adversely affect recycling, and colored materials can be readily used to provide a desirably colored container, for example, the outer layer can be easily colored in a desirable commercial color.

The present container offers the significant advantages of a mono-layer container with desirable engineered properties, as barrier resistance and low cost. Thus, processing is significantly easier than with multi-layer containers since one is working with a mono-layer material without the necessity for the use of liners and complicated coinjection processing. Further, one can blend the recycled plastic with other materials to readily obtain special properties while still retaining the use of desirably low cost recycled plastic. For example, one could customize the product in order to obtain desirable characteristics while still using recycled material and a mono-layer material.

The internal carbon coating is simply and conveniently applied and is quite thin and yet precludes the migration of adverse flavors and taste into the contents of the container. It is particularly desirable to use a variety of colors for the recycled plastic as for example an amber color for beer. It would be highly desirable to use such a container as in the present invention with a tailored color and for a beer or soft drink or juice product. As a still further alternative, one could blend heat resistant plastic with the recycled plastic to obtain highly desirable characteristics.

Although certain preferred embodiments of the present invention have been described, the invention is not limited to the illustrations described and shown herein, which are deemed to be merely illustrative of the best modes of carrying out the invention. A person or ordinary skill in the art will realize that certain alternatives, modifications, and variations will come within the teachings of this invention and that such alternatives, modifications, and variations are within the spirit and the broad scope of the appended claims.

What is claimed is:

1. A method of manufacturing a container coated with a carbon coating, which comprises:
   providing a container including an upper wall portion having an opening, an intermediate side wall portion positioned beneath the upper wall portion, a base portion positioned beneath the intermediate wall portion and supports the container, said container further comprising a molded outer single layer having a vertical length and an inner surface and including recycled plastic content, said outer layer having a thickness of from 6 to 23 mils;
   enclosing the container within a hollow space provided to accommodate the container;
   discharging the air within the container and creating a vacuum;
   charging the internal volume of the container with raw gas; and
   forming a carbon coating from said raw gas on the inner surface of the container to provide an innermost, amorphous carbon coating formed on the entire inner surface of the outer layer and adhered thereto, with said carbon coating having a thickness of from about 0.05 to 10 microns and wherein the thickness of the carbon coating controllably varies along the vertical length of the container, wherein the recycled plastic content does not come into contact with contents of the container, and wherein said container can be recycled.

2. A method according to claim 1, including charging the internal volume of the container with raw gas selected from the group consisting of aliphatic hydrocarbons, aromatic hydrocarbons, oxygen containing hydrocarbons, and mixtures of two or more of such gases.

3. A method according to claim 1, wherein the formation of the carbon coating on the inner surface of the container is induced by a high frequency electric source.

4. A method according to claim 3, including providing that the high frequency electric source includes an internal electrode and an insulated external electrode for generating negative self-bias.

5. A method according to claim 1, wherein the formation of carbon coating on the inner surface of the container is induced by a microwave.

6. A method according to claim 1, including providing that the outer layer includes at least 75% by weight of recycled plastic.

7. A method according to claim 1, including the step of forming the carbon coating with the weight of the carbon coating being less than about $1/10,000^{th}$ of the total weight of the container.

8. A method according to claim 1, wherein the step of forming the carbon coating on the inner surface of the container includes the rotation of the container about the central vertical axis thereof.

9. A method according to claim 8, wherein the rotation includes high-speed rotation.

10. A method according to claim 1, including a transferring process for handling the container.

11. A method according to claim 10, wherein the transferring process includes rotation of the container.

12. A method according to claim 8, including a transferring process for handling the container with rotation of the container during the transferring process, the rotation of the transfer process is in a direction opposed to the direction of the container during the carbon coating of the inner surface of the inner layer.

13. A method according to claim 1, including the step of providing that a receiving mechanism seals the opening of the container to produce a substantially air-tight seal prior to the complete discharging of the air within the container.

14. A method according to claim 13, including the step of providing that the receiving mechanism is revolved around the central axis of the container and secures the container.

15. A method according to claim 13, including the step of providing that the receiving mechanism includes at least two apertures for the communication of gases.

16. A method according to claim 13, including the step of providing that the receiving mechanism is in communication with a vacuum source.

17. A method according to claim 1, wherein the vacuum created is within the range of about $10^{-2}$ to $10^{-5}$ torr.

18. A method according to claim 1, including a flow rate charging the internal volume of the container with raw gas within the range from about 1 to 100 ml/min.

19. A method according to claim 1, including using high frequency to charge the gas and to control the thickness of the carbon coating on the inner surface.

20. A method according to claim 1, including forming the outer layer from at least 90% of recycled plastic.

21. A method according to claim 1, including varying the thickness of the outer layer so that the intermediate sidewall portion is thinner than the upper wall portion and the base portion.

22. A method according to claim 1, including adding a barrier material to the outer layer.

23. A method according to claim 1, including the step of providing said single layer container in the form of a blow molded container.

24. A method according to claim 1, including forming a carbon coating comprised of hydrogenated, amorphous carbon that is doped with nitrogen.

25. A method according to claim 1, including forming the outer layer from at least 50% of recycled plastic.

* * * * *